United States Patent [19]

Lassaux et al.

[11] Patent Number: 4,649,335

[45] Date of Patent: Mar. 10, 1987

[54] EQUIPMENT FOR LOCATING A SIGNAL REFLECTION POINT IN A TRANSMISSION LINE

[75] Inventors: Jean Lassaux, Lannion; Henry Clement, Kermaria Sulard, both of France

[73] Assignee: Telecommunications Radioelectriques et Telephoniques, Paris, France

[21] Appl. No.: 678,322

[22] Filed: Dec. 5, 1984

[30] Foreign Application Priority Data

Dec. 7, 1983 [FR] France ............................... 83 19570

[51] Int. Cl.$^4$ ............................................. G01R 31/08
[52] U.S. Cl. ........................................ 324/52; 379/26
[58] Field of Search ................... 324/51, 52, 54, 58 B, 324/58.5 B, 73 R; 307/511, 514; 328/110; 364/507, 552; 371/24, 25; 179/175.3 F, 170.2

[56] References Cited

U.S. PATENT DOCUMENTS

| | | | |
|---|---|---|---|
| 4,041,381 | 8/1977 | Hwa | 324/58.5 B X |
| 4,210,904 | 7/1980 | Renzel et al. | 364/507 X |
| 4,577,309 | 3/1986 | Barazeche et al. | 179/170.2 X |
| 4,605,826 | 8/1986 | Kanemasa | 179/170.2 |

*Primary Examiner*—Reinhard J. Eisenzopf
*Assistant Examiner*—Jack B. Harvey
*Attorney, Agent, or Firm*—Marianne R. Rich; Leroy Eason

[57] ABSTRACT

In an equipment for locating a reflection point in a transmission line a recording is obtained of the impulse response of the path of the echo produced by a transmission signal based on a reference signal $x(n)$ constituted by binary sequences of duration NT which comprise only one bit of non-zero value. At the reception end, the equipment comprises a memory for storing N coefficients $C_i$ which are read cyclically with a view to being modified by successive iterations, each coefficient being modified once per read cycle by the term $\alpha \cdot \text{Sgn}[e(n)]$, where $\text{Sgn}[e(n)]$ is the sign of the difference between the signal received and the coefficient read at a moment NT and $\alpha$ is a constant less than 1. The coefficients modified and written into the memory form the values of the desired impulse response.

6 Claims, 2 Drawing Figures

EQUIPMENT FOR LOCATING A SIGNAL REFLECTION POINT IN A TRANSMISSION LINE

BACKGROUND OF THE INVENTION

1. Field of the Invention

The invention relates to equipment for locating and/or characterizing a reflection point in a transmission line by recording the impulse response of the path of an echo produced at said reflection point in response to a transmission signal, said equipment comprising a transmission path and a reception path coupled to the transmission line by a coupling circuit, the transmission signal being derived from a reference signal constituted by binary sequences of the same duration NT equal at least to twice the propagation time in the transmission line, N being an integer and T being the duration of a bit.

The equipment envisaged may be used in particular for the location and characterization of a result of a fault in a transmission line. It is known that if at some point in a transmission line a fault occurs that gives rise to an irregularity in the electric parameters, the value of the characteristic impedance at that point will be modified and any incident wave will give rise to a reflected wave called an "echo". Measurement, at the input of the transmission line, of the time separating the transmission of an incident wave and the return of the reflected wave makes it possible, the propagation speed being known, to determine the distance between the point of measurement and the location of the fault. In addition, the phase and amplitude characteristics of the reflected wave enable the nature of the fault to be determined (short-circuit, open circuit or grounding) as well as its intensity.

2. Description of the Prior Art

Among the equipments utilizing echo measurements for locating and characterizing faults in transmission lines, relatively rudimentary workshop equipments are known in which the locating and characterization of the fault are preformed by an operator observing a display screen on which there appears the echo signal received in response to a transmitted pulse.

This type of equipment often requires manual adjustment of the balance impedance of the coupling circuit, while the measurements may be very disturbed by the line noise. Furthermore, with this type of equipment it is not possible, for example, to provide for automatic maintenance of all the subscriber lines connected to a telephone exchange. For that it is necessary, as in the equipment envisaged, for all the echo measurements to be recorded automatically in a memory in digital form, for subsequent processing by a computer.

The U.S. Pat. No. 4,041,381 also describes an equipment enabling the location and characterization of a fault in a transmission line. In this equipment a train of identical pulse sequences is transmitted along a transmission line, the autocorrelation function of the sequences being an impulse function. Correlation calculations are made between the received signal and the transmission sequences successively delayed by steps of time delay until there is found in the calculated signal a peak indicating the correlation between the transmitted signal and the received signal. This process can provide a digital recording of the impulse response of the echo path, but it has the drawback of requiring a substantial volume of calculations and of memory capacity, as well as being sensitive to noise on the transmission line, which limits the maximum distance at which a fault can be detected.

SUMMARY OF THE INVENTION

The object of the present invention is to provide an equipment which can easily be implemented in an automatic transmission line maintenenace system, while avoiding the disadvantages of known equipments.

In accordance with the invention, an equipment for locating and/or characterizing a signal reflection point in a transmission line is characterized in that the binary sequences of the reference signal comprise only a single bit of non-zero value, equal to 1 (or alternatively 1 and $-1$) and at the receiving end a memory is provided for N coefficients $C_i$ (i being an integer going from 0 to $N-1$) which are read cyclically at the instants $nT=(KN+j)T$ with a view to being modified by successive iterations, n being an integer going from $-\infty$ to $+\infty$, K being an integer going from $-\infty$ to $+\infty$ and characterizing each read-out cycle, j being an integer going from 0 to $N-1$ and characterizing the read-out instant in a read-out cycle, comparison means forming at each moment nT the difference $e(n)$ between the received signal and each read coefficient converted to an analog signal, or the sign of $e(n)$, $Sgn[e(n)]$, means being provided for modifying each coefficient $C_i$ once per reading cycle, at instants such that $j=i$, by means of an additive modification term equal to $\alpha.e(n)$ or $\alpha.Sgn[e(n)]$, $\alpha$ being a coefficient less than 1, the read coefficients being written after each modification into said memory, the coefficients $C_i$ written into the memory constituting, after a sufficient number of modifications, the values (or the values at the sign taken) at the instant iT of the impulse response of the echo path.

For testing transmission lines generating distortions that may deform the echo received, it is advantageous, in accordance with a variant of the invention, for the transmission signal to be a filtered version of the reference signal, with a predetermined filtering function for compensating at least approximately the distortions produced by the transmission lines under test, the impulse response corresponding to this filtering function extending at the most over the duration NT of the sequences constituting the reference signal.

To remove noise and low-frequency jitter that may affect the modified coefficients, the equipment according to the invention advantageously comprises an accumulator circuit for forming, as from a certain time and during a certain number of iterations, the sum of each of the modified coefficients $C_i$, the mean values of the coefficients $C_i$ being derived from the sums thus formed to be used as values of the impulse response of the echo path.

Features of the invention will be more fully appreciated from the following description of an exemplary embodiment when considered in conjunction with the accompanying drawings.

DESCRIPTION OF THE PREFERRED EMBODIMENTS

Figure 1:
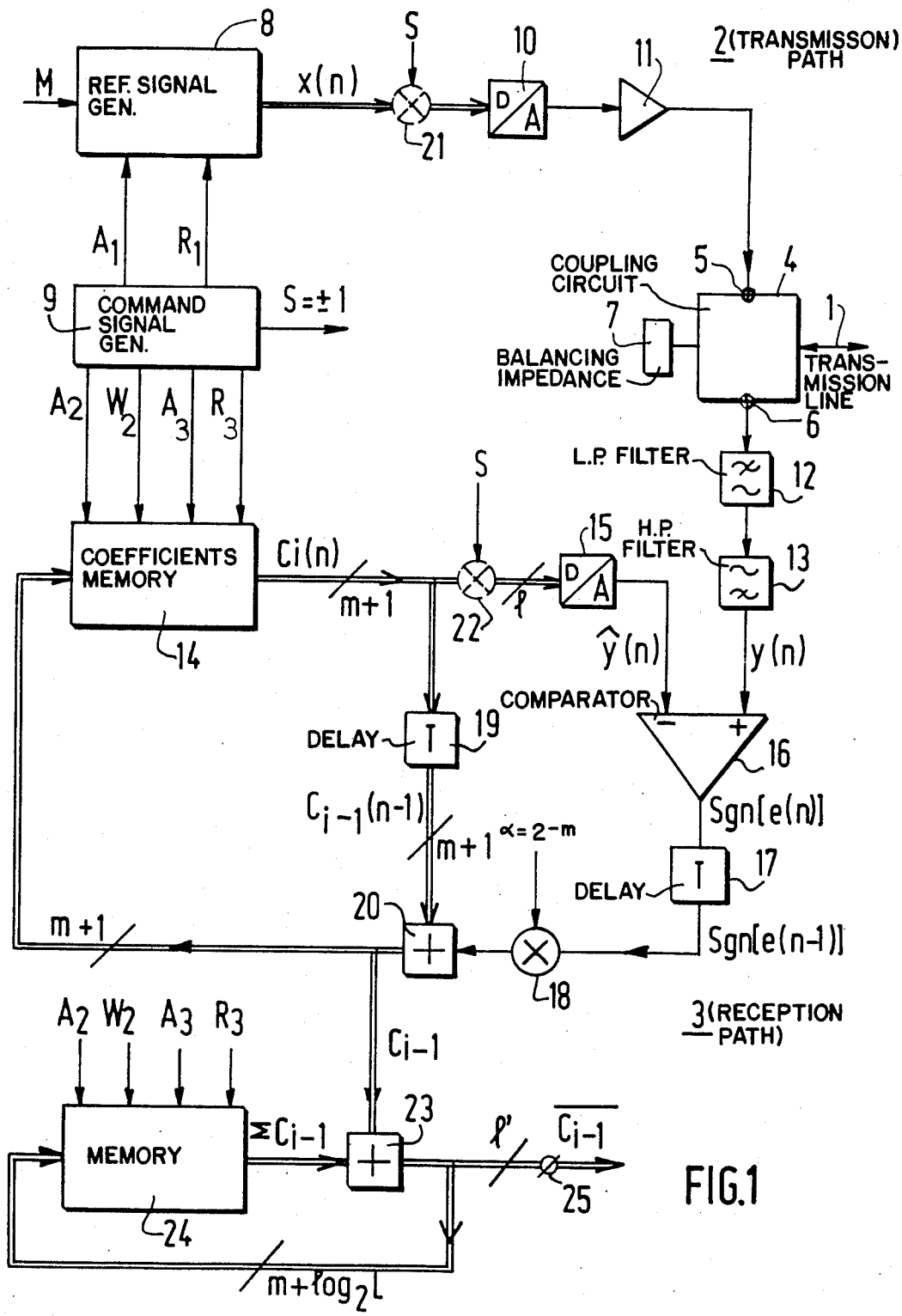
FIG. 1 shows a diagram of an equipment in accordance with the invention.

The object of the equipment of the invention shown in FIG. 1 is to locate and/or characterize a signal reflection point in a transmission line 1, this reflection point being produced for example by a fault in the transmission line. This equipment comprises a transmission path 2 and a reception path 3 which are coupled to the transmission line 1 by means of a coupling circuit 4, via a transmission port 5 and a reception port 6 of this coupling circuit. The coupling circuit 4, in itself known, is provided with a balance impedance 7 which, when it is appropriately adjusted, makes it possible to direct virtually all the transmission signal towards the line 1, while preventing this signal from directly entering the reception path 3. In these conditions, if a signal is received at the port 6 of the coupling circuit, it can in practice only come from an echo produced in the transmission line, in particular by a fault, in response to a signal transmitted in the direction of that line.

An object of the equipment according to the invention is to provide in digital form a recording of the impulse response of the echo path, with a view to deducing the distance and the nature of the fault that has produced the echo.

The time of observation of this impulse response must extend from the instant of transmitting the pulse to the instant the reflected pulse is completely received, for the longest transmission line to be tested. For example, for testing telephone lines with a maximum length of 10 km, and in which the speed of propagation is 200 m/$\mu$s, it is easily seen that an observation time of the order of 100 $\mu$s is suitable. In the same conditions it can be seen that, if an accuracy of 100 m is required for locating a reflection point, the measurement of the instant of return of the echo must be made with an accuracy of 1 $\mu$s.

The transmission path 2 contains a reference signal generator 8. This reference signal is constituted by binary sequences of the same duration NT, N being an integer and T being equal to the duration of a bit. The duration NT of a sequence is at least equal to twice the propagation time Z in the maximum length of the transmission line, in order that during the length of a sequence it is possible to observe at the same time an echo and the transmitted signal that gave rise to this echo. In the given example of a maximum line length of 10 km and a propagation speed of 200 m/$\mu$s, the duration NT of each sequence should be at least 100 $\mu$s; an accuracy of 100 m for the corresponding location requires a duration T=1 $\mu$s for each bit, such that each sequence should comprise at least N=100 bits. The generator 8 may for example be a memory storing in N addresses the bits forming a sequence. This memory is read by means of an address signal A1 and a read signal R1 supplied by a command signal generator 9, in such a way that at the output of the memory the bits appear at a rate 1/T and the sequence at a rate 1/NT. The reference signal thus formed takes the values x(n) at the instants nT.

The signal x(n) is applied to a digital-to-analog converter 10 and the analog signal obtained, amplified in an amplifier 11, is sent along the transmission line 1 by the intermediary of the coupling circuit 4.

The reception path 3 contains at its input a filtering circuit consisting of a low-pass filter 12 and a high-pass filter 13 for removing from the received signal the frequency components situated outside the useful band of the transmission line.

In the known equipment, described in the above-mentioned U.S. Pat. No. 4,041,381, the signal sequences x(n) have an autocorrelation function presenting an impulse function, and the correlation function is calculated between the received signal and the transmitted sequences, successively delayed one with respect to the other by steps of time delays. If a correlation is found between the received signal and the transmitted sequences delayed by a step of time delay the impulse response of the echo path may be derived therefrom. The correlation calculations made in this way involve a substantial volume of calculations and of memory capacity, while on the other hand nothing appears to be done to reduce the sensitivity of the equipment to noise on the transmission line.

These drawbacks are avoided with the equipment according to the invention thanks to the judicious adaptation of techniques utilized in adaptive echo cancellers. Before describing the structure and operation of the equipment according to the invention, it will be useful first to recall the general principle of an adaptive echo canceller.

It is assumed that a signal taking the values x(n) at the instants nT is generated in the transmission path 2 in the direction of the transmission line 1. If an echo is produced in this line, the signal y(n) received on the reception path 3 at the instants xT may be written:

$$y(n) = \sum_{i=0}^{\infty} hi \cdot x(n - i) + v(n) \quad (1)$$

The first of the second member of this expression is the received echo signal, in which hi represents the impulse response of the echo path sampled at the instant iT. The second term v(n) represents the noise present in the line.

A classical echo canceller comprises a digital filter having N coefficients Ci (i=0, ..., N−1), adjusted to supply a synthetic echo signal (n) such that:

$$y(n) = \sum_{i=0}^{N-1} Ci \cdot x(n - i) \quad (2)$$

The number N of filter coefficients must be such that NT is at least equal to the delay of the echo relative to the transmitted signal which produced it, that is NT$\geq$2Z.

The coefficients Ci are adjusted by forming in the echo canceller the difference signal e(n) between the received signal y(n) and the synthetic echo signal (n):

$$e(n) = \hat{y}(n) - y(n).$$

Uing expressions (1) and (2) above, with i=0, 1, ... N−1, one obtains:

$$e(n) = \sum_{i=0}^{N-1} (hi - Ci) \cdot x(n - i) + v(n) \quad (3)$$

The coefficients Ci are calculated by successive iterations in such a way as to minimize the error signal:

$$\epsilon(n) = \sum_{i=0}^{N-1} (hi - Ci) \cdot x(n - i) \qquad (4)$$

After a sufficient number of iterations, the echo canceller converges and one obtains $\epsilon(n) \approx 0$, that is to say $hi \approx Ci$, such that the coefficients Ci of the digital filter constitute an approximation of the impulse response hi of the echo path.

It is general practice to use the gradient algorithm to adjust the coefficients, which, for adjusting the coefficients Ci, leads to the classical iteration (recursion) formula:

$$Ci(n+1) = Ci(n) + \alpha \cdot x(n-i) \cdot e(n) \qquad (5)$$

In this formula Ci(n) is a coefficient Ci at an instant nT which must be modified by the modifications term $\alpha \cdot x(n-i) \cdot e(n)$ to form the modified coefficient Ci(n+1) to be used at the moment (n+1)T. Here $\alpha$ is a coefficient less than 1 which determines the gain of the control loop.

Often, to simplify the implementation of the algorithm, e(n) in the iteration formula (5) is replaced by the sign of e(n), thus Sgn[e(n)]. Moreover a coefficient $\alpha$ of the form $2^{-m}$ is generally taken. The iteration formula (5) then becomes:

$$Ci(n+1) = Ci(n) + 2^{-m} \cdot x(n-i) \cdot Sgn[e(n)] \qquad (6)$$

With this formula (6), in the case where the reference signal x(n) is binary, the modification of the coefficients at each instant such as xT is a simple process of incrementing or decrementing by the elementary binary number $2^{-m}$. The larger the number m the weaker the gain of the control loop and the more insensitive is the echo canceller to noise v(n) present in the line, but the convergence is then slower and the number of bits necessary for representation of the coefficients is larger.

It is known that an echo canceller of the type described in the foregoing may converge if one uses a reference signal x(n) formed by a pseudo-random sequence cyclically repeated and if the duration NT during which the filter stores the bits of the reference signal is such that the filter does not store more than one sequence of the reference signal.

It will now be shown how this echo cancellation technique is used in the equipment according to the invention and adapted so as to result in an extremely simple embodiment, reducing in an optimum manner the sensitivity to noise.

Figure 2:
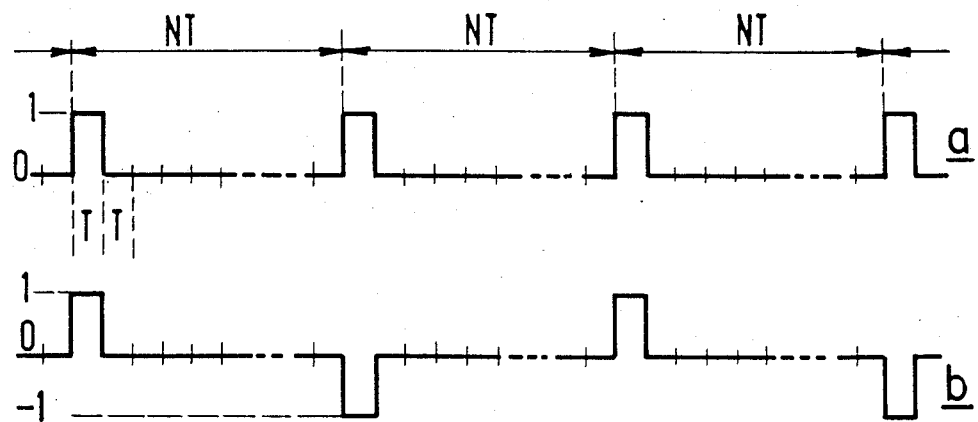
FIG. 2 shows in diagrams a and b two possible forms for the reference signal utilized in the equipment according to the invention.

In an embodiment of the invention, the binary sequence cyclically repeated and serving to form the reference signal x(n) comprises only a single non-zero element (bit) of value equal to 1. The diagram a in FIG. 2 represents the signal x(n) formed in this manner. Such a sequence has the pseudo-random character required for assuring the convergence of an adaptive echo canceller, since it presents no periodicity internally. The duration of the sequence is chosen equal to the duration NT of the filter storage.

With such a reference signal, expression (2) above giving the calaculations to be made to obtain each sample (n) of the synthetic echo signal, is simplified because among the N samples x(n−i) of the reference signal stored in the memory of the digital filter of the echo canceller a single sample is taken non-zero and equal to 1. If the sampling moments nT are put in the form nT=KNT+jT, where K is an integer going from −∞ to +∞ and characterizes the periods of duration NT and j is an integer going from 0 to N−1 and characterizes the sampling moments within each period NT, expression (2) reduces to:

$$\tilde{y}(n) = Ci \qquad (7)$$

for the instants nT such that j=i.

In other words, N approximate samples (n) of the impulse response of the echo path during a duration NT may be obtained simply by reading N coefficients Ci stored in a memory. These N samples at the instants j=0, 1 ... N−1 within any given period are respectively the coefficients Co, C1, ... C N−1.

The adjustment of these coefficients Ci is made in accordance with the gradient algorithm which can be implemented by one of the iteration (recursion) formulae (5) and (6) as has been shown above. With the reference signal described above, the N coefficients Ci are modified in the cource of a period NT and each coefficient Ci is modified only once per period at the instants nT such that j=i. The iteration formula (6) may for example be written:

$$Ci(K+1) = Ci(K) + 2^{-m} \cdot Sgn[e(n)] \qquad (8)$$

In this formula, Ci(K) is the coefficient Ci read in the period K at an instant such that j=i, in order to be modified, and Ci (K+1) is this same coefficient modified to be read in the next period K+1, at the instant such that j=i.

It may be noted that in the iteration formula (8) the error signal e(n) now has the very simple form e(n)=y(n)−Ci(n), which shows that each coefficient is modified independently of the other coefficients.

In this way, the modification of a coefficient is not affected by the errors of calculation or the noise affecting the N−1 other coefficients.

Finally, by using in the equipment according to the invention an echo canceller with a reference signal as described in the diagram a(FIG. 2), one obtains very simply the impulse response of the desired echo path by reading in a memory N coefficients modified by successive iterations in accordance with formula (8). This device is particularly insensitive to noise in the line, due to the fact that the modifications on each coefficient are not tributary to the other coefficients.

Instead of utilizing the reference signal described above and represented in the diagram a(FIG. 2), one may also utilize a reference signal formed, as indicated in the diagram b(FIG. 2), by successive sequences of duration NT in which the non-zero element takes alternatively the value +1 and the value −1. The reference signal b(FIG. 2) shows the feature, which may sometimes be interesting, of not involving a continuous component. In this case, the above expression (2) giving y(n) becomes:

$$\tilde{y}(n) = \pm Ci \qquad (9)$$

for the instants nT such that j=i.

In other words the N samples y(n) of the impulse response of the echo path during a period NT may be obtained by reading N coefficients Ci in a memory and by changing or not changing the sign of these coefficients in accordance with the parity of the period NT.

The N coefficients Ci are modified as described above in the case of a reference signal of the type represented in the diagram a(FIG. 2) applying or not applying, however, a change of sign to the coefficients to be modified.

The equipment according to the invention pursuant to the method described above may be implemented and may operate as will now be described with reference to FIG. 1. Consider first the case where the reference signal x(n) has the form shown in the diagram a(FIG. 2). The number of bits of each sequence is for example N=128 and the duration of each bit is T=1 μs.

The reference signal x(n) is supplied for example at the output of the memory 8 which stores the N bits of a sequence and which, as already explained, is read with the aid of the address signal A1 and the read signal R1. This reference signal x(n) is applied to the transmission port 5 of the coupling circuit 4 via the converter 10 and the amplifier 11.

The equipment according to the invention comprises at the receiving end a memory 14 in which N coefficients Ci may be written with the aid of a write signal W2 at N addresses characterized by i and determined by an address signal A2. These N coefficients written at these addresses may be subsequently read from these addresses by means of a read signal R3 and an address signal A3. These command signals A2, W2 and A3, R3 are generated in the command signal generator 9. They are periodic. The read and write signals R3 and W2 have the frequency 1/T and the address signals A2 and A3 have the frequency 1/NT, the address signal A3 for reading being simply the address signal A2 for writing shifted for example in advance by the period T.

Each of the coefficients Ci(n) read in the memory at an address and at an instant nT such that the i=j constitutes, as explained, an approximate value (n) of the impulse response of the echo path, after a sufficient number of modifications by successive iterations. To modify the coefficients in accordance with the iteration formula (8), each coefficient Ci(n) formed of (m+1) bits (for example m+1=16), is applied to a digital-to-analog converter 15 which uses only the 1 most significant bits, for example 1=12. Each analog sample of the approximate value (n) of the impulse response of the echo path is applied to the negative input of a comparator 16. Applied to the positive input of this comparator is the signal received from the transmission line, filtered by means of filters 12 and 13 and taking the value y(n) at a moment xT. The output of the comparator thus supplies at each instant nT the sign with the signal of y(n)− (n), that is to say Sgn[e(n)] in accordance with the notation of formula (8).

This signal is applied to a pulse-shaping flip-flop 17 producing a delay T such that there appears at the output of this flip-flop 17 at a given instant nT the signal formed at the preceding instant (n−1)T, that is Sgn[e(n−1)]. The signal Sgn[e(n−1)] is applied to a multiplier circuit 18 for giving the sign + or the sign − to the quantity $2^{-m}$, thereby forming the modification term $Sgn[e(n-1)].2^{-m}$.

Each coefficient Ci(n) read from the memory 14 at an instant nT is applied on the other hand to a circuit 19 providing a delay T such that at this instant of reading nT there appears at the output of the circuit 19 the coefficient Ci−1(n−1) previously read at the instant (n−1)T. This is the coefficient suitable for being modified by the modification term $Sgn[e(n-1)]2^{-m}$. An adder 20 form the sum of this modification term and the coefficient Ci−1(n−1). The coefficient Ci−1 thus modified is written into the memory 14 at the address i−1 by means of the address signal A2 and of the write signal W2.

After a sufficient number of iterations, samples of the impulse response of the echo path during the period NT of a sequence are obtained practically in the form of coefficients Ci recorded in the memory 14. These coefficients may be subsequently read for processing in a computer, for example. Such processing may be done to determine the delay of the echo with respect to the beginning of a sequence in order to locate the reflection point, as well as to determine the form and amplitude of the echo in order to characterize the fault in the transmission line.

To reduce the time of convergence of the coefficients to the desired impulse response, while preserving good stability in the equipment, it is possible, in accordance with a known technique used in echo cancellers, to modify the convergence the value of the coefficient $\alpha = 2^{-m}$ fixing the amplitude of the modification increments of the coefficients. One may use, for example, three values of α, beginning with a high value and ending with a low value corresponding to the required precision for the coefficients.

In the case where the reference signal shown in diagram b(FIG. 2) is used, the equipment of FIG. 1 may suffice, subject to very simple modifications. One may for example insert in the transmission path 2 a multiplier 21, shown by dashed lines, which multiplies the numbers read from the reference signal generator 8 by −1, one sequence NT in two. For that purpose the multiplier 21 receives from the reference signal generator 8 a signal S of frequency ½ NT and taking alternatively the values +1 and −1. At the receiving end, in order to form the synthetic echo signal (n) applied to the comparator 16, changing or not the sign of the coefficients Ci as explained above (see formula 9), use is made of a multiplier 22 which is interposed in the path of the coefficients Ci going to the memory 14 and which receives the signal S as just defined.

The equipment according to the invention as just described may be improved by applying to the transmission path a filtered version of the reference signal a(FIG. 2) or b(FIG. 2). This precorrection filter, which is useful for the longest transmission lines, serves the purpose on the one hand of compensating amplitude and propagation time distortions of the line in the useful frequency band in order to preserve the pulsed character of the echo received, and on the other hand the purpose of concentrating the energy of the transmitted signal in the strictly necessary frequency band. To implement a filter of this type, the only requirement is that the impulse response must extend at least over the duration NT of a sequence such that this filtered signal remains periodic with the period NT. In practice, such precorrection filtering of the transmission signal can be implemented without increasing the complexity of the device described with reference to FIG. 1. It suffices to store in the memory 14 the sets of bits representing the impulse response of the desired filter, this memory being read with the aid of the command signals A1, R1. No modification of the equipment is necessary at the receiving end.

This system of precorrection filtering increases the range of the equipment according to the invention for the longest lines whereas for the shortest lines it may be preferable to return to the equipment without precorrection filtering. A command signal M applied to the reference signal generator 8 can enable read-out either of a non-filtered signal or of a filtered signal (with possibly differing filtering functions) depending on the transmission line to be tested.

Another refinement that may be made to the equipment according to the invention as described up to the present consists in "smoothing" each coefficient Ci and calculating the time average as from an instant at which the convergence of the coefficients is well advanced, during a sufficiently long integration period. For example, calculation of the means of the coefficient Ci can begin after $2^{12}$ iterations of modifications of the coefficients, that is to say about 500 ms in the given example where the time interval NT between the iterations is equal to 128 $\mu$s. The integration period of the coefficients may equally be 500 ms. The use of coefficients thus smoothed for echo measurements makes it possible to practically eliminate noise and low-frequency jitter which may affect the modified coefficients, in particular jitter that may originate from currents of industrial frequency induced in the line.

To implement the smoothing of the coefficients the equipment in FIG. 1 comprises an accumulator system formed by an adder 23 receiving on the one hand the modified coefficient Ci−1 available at the output of the adder 20, and on the other hand the sum term of the coefficients $\Sigma$Ci−1 read from a memory 24 with the aid of the read signal R3 and of the address signal A2. The new sum term formed at the output of the adder 23 is written into the memory 24 by means of the write signal W2 and the address signal A3. If the modified coefficients Ci−1 applied to the adder 23 have l bits and if the accumulator forms the sum of L modified coefficients, the sum terms $\Sigma$Ci−1 read from the memory 24 have (1+log$_2$L) bits. The mean value $\overline{Ci-1}=1/L\Sigma Ci-1$ may easily be formed at the terminal 25, in the case where L is a power of 2 (for example L=$2^{12}$), by omitting log$_2$L bits (12 bits) from the sum terms available at the output of the adder 23. The "smoothed" coefficients $\overline{Ci-1}$ of l' bits thus appearing at the output of the adder 23 during a period NT may be utilized or stored in a memory, not shown, after the time required for the convergence of the equipment.

What is claimed is:

1. In equipment for identifying a reflection point in a transmission line by determining the impulse response characteristic of said line for an echo signal produced at said reflection point in response to a transmission signal; said equipment having transmission means for generating the transmission signal, reception means for receiving the echo signal, and a coupling circuit for coupling said transmission means and said reception means to said transmission line; said transmission means comprising means for generating a reference signal constituted by successive binary sequences each having a duration NT equal to at least twice the propagation time of each such sequence over said transmission line, N being an integer and T being the duration of a bit in each such sequence, and means for producing said transmission signal from said reference signal; the improvement characterized in that said binary sequences of said reference signal each comprise only a single bit of non-zero value and in that said reception means comprises:

memory means for storing N coefficients Ci, i being an integer going from 0 to N−1;

means for cyclically reading-out said coefficients Ci from said memory means at instants nT, where nT=(KN+j)T, and modifying the read-out coefficients Ci by successive iterations to thereby derive modified coefficients, n being an integer going from $-\infty$ to $+\infty$, K being an integer going from $-\infty$ to $+\infty$ and which characterizes each read-out cycle, and j being an integer going from 0 to N−1 and which characterizes the instant of read-out in a read-out cycle;

digital-to-analog converting means connected to said memory means for converting said read-out coefficients Ci to an analog signal;

comparison means connected to said converting means and to said coupling circuit for deriving at each read-out instant nT the difference e(n) between said received echo signal and the analog signal produced by said converting means, thereby also deriving the sign of e(n), Sgn e(n);

and means coupled to said comparison means and to said cyclic read-out means for modifying each of said coefficients Ci once during each read-out cycle at instants at which j=i, such modification comprising addition to each coefficient Ci of a term equal to $\alpha$.e(n) or $\alpha$.Sgn (e(n)), $\alpha$ being a coefficient less than 1;

and means for storing said modified coefficients in said memory means;

whereby the modified coefficients stored in said memory means constitute, after a sufficient number of said modifications, the values at the instants nT of the impulse response characteristic of said line for said echo signal which values are processed to identify the reflection point.

2. Equipment as claimed in claim 1, wherein said coefficient $\alpha$ is of the form $2^{-m}$, m being an integer.

3. Equipment as claimed in claim 1, further comprising an accumulator circuit for forming, as from a certain time and during a certain number of iterations, the sum of said modified coefficients, the mean values of said modified coefficients being derived from the sums thus formed to constitute values of the impulse response characteristic of said line for the echo signal.

4. Equipment as claimed in claim 1, wherein the value of said single bit of each of said binary sequences is +1.

5. Equipment as claimed in claim 1, wherein the value of said single bit of successive ones of said binary sequences is, alternately, +1 and −1.

6. Equipment as claimed in claim 1, wherein said means for producing said transmission signal from said reference signal comprises filtering means having a predetermined filtering function for approximately compensating the distortions produced by said transmission line, the filtering function having an impulse response extending at the most over said duration NT of said sequences constituting said reference signal.

* * * * *